United States Patent
Stock et al.

(10) Patent No.: US 9,252,528 B2
(45) Date of Patent: Feb. 2, 2016

(54) PRINTED CIRCUIT BOARD, METHOD OF MANUFACTURING SAME, AND METHOD OF MOUNTING THE CIRCUIT BOARD IN A CONNECTOR SOCKET

(71) Applicant: GERMANE SYSTEMS, LC, Chantilly, VA (US)

(72) Inventors: Michael Stock, Fairfax, VA (US); Scott Semmler, Fairfax, VA (US)

(73) Assignee: GERMANE SYSTEMS, LLC, Chantilly, VA (US)

( * ) Notice: Subject to any disclaimer, the term of this patent is extended or adjusted under 35 U.S.C. 154(b) by 76 days.

(21) Appl. No.: 13/933,288

(22) Filed: Jul. 2, 2013

(65) Prior Publication Data

US 2015/0011128 A1    Jan. 8, 2015

(51) Int. Cl.

| | |
|---|---|
| *H01R 13/533* | (2006.01) |
| *H05K 3/00* | (2006.01) |
| *H05K 7/14* | (2006.01) |
| *H05K 1/14* | (2006.01) |
| *H01R 12/70* | (2011.01) |
| *H05K 3/36* | (2006.01) |

(52) U.S. Cl.
CPC .............. *H01R 13/533* (2013.01); *H05K 1/141* (2013.01); *H05K 3/00* (2013.01); *H05K 7/1405* (2013.01); *H01R 12/7029* (2013.01); *H05K 3/366* (2013.01); *H05K 2201/09045* (2013.01); *H05K 2201/09909* (2013.01); *H05K 2201/10159* (2013.01); *H05K 2201/10325* (2013.01); *H05K 2201/10606* (2013.01); *Y10T 29/49117* (2015.01); *Y10T 156/1089* (2015.01)

(58) Field of Classification Search
CPC .................. H01R 13/62938; H01R 13/62955; H01R 12/721; H01R 13/62933
USPC .................................................. 439/157–160
See application file for complete search history.

(56) References Cited

U.S. PATENT DOCUMENTS

| | | | | |
|---|---|---|---|---|
| 4,373,764 | A | | 2/1983 | Ulrich |
| 5,141,444 | A | * | 8/1992 | Redmond .............. H01R 13/15 439/59 |
| 5,470,242 | A | * | 11/1995 | Cheng ................ H01R 12/7005 439/155 |
| 5,603,628 | A | | 2/1997 | Schapiro, Jr. |
| 5,784,263 | A | * | 7/1998 | Nelson ................. H01R 12/721 361/748 |
| 5,923,531 | A | | 7/1999 | Bachman et al. |
| 5,980,282 | A | * | 11/1999 | Cheng ................ H01R 12/7005 439/155 |
| 6,056,579 | A | * | 5/2000 | Richards, III ...... H01R 12/7005 439/327 |

(Continued)

FOREIGN PATENT DOCUMENTS

FR    2783100    3/2000

*Primary Examiner* — Truc Nguyen
(74) *Attorney, Agent, or Firm* — Nixon & Vanderhye P.C.

(57) ABSTRACT

A circuit board that is to be mounted in a connector socket includes a plurality of electrical connectors located along a side edge of the circuit board. Retention bosses are formed on first and second opposite sides of the circuit board, each of the retention bosses protruding from a surface of the circuit board and extending parallel to and adjacent to the first edge of the circuit board. When the first edge of the circuit board is inserted into a slot of a connector socket, contact surfaces of the first and second retention bosses contact top surfaces of the connector socket to help immobilize the circuit board with respect to the connector socket. Adhesive layers on the contact surfaces of the first and second retention bosses may adhere to the top surfaces of the connector socket to help hold the circuit board immobile with respect to the connector socket.

4 Claims, 8 Drawing Sheets

(56) References Cited

U.S. PATENT DOCUMENTS

| | | | |
|---|---|---|---|
| 6,331,940 B1* | 12/2001 | Lin ................... H05K 7/1431 | |
| | | | 361/785 |
| 6,409,518 B1 | 6/2002 | Hung | |
| 6,971,900 B2* | 12/2005 | Liebenow .......... H01R 12/7029 | |
| | | | 439/327 |
| 7,147,476 B1 | 12/2006 | Chang et al. | |
| 7,477,524 B2 | 1/2009 | Way | |
| 7,515,437 B2 | 4/2009 | Dean et al. | |
| 7,677,907 B2* | 3/2010 | Guan ................ H01R 12/7029 | |
| | | | 439/157 |
| 7,713,066 B2 | 5/2010 | Hass | |
| 7,850,475 B1* | 12/2010 | Feldman et al. ............... 439/328 | |
| 8,254,123 B2 | 8/2012 | Sun | |
| 8,556,652 B2* | 10/2013 | Kang ................ G02F 1/13452 | |
| | | | 439/492 |
| 2005/0181642 A1* | 8/2005 | Juntwait ..................... 439/76.1 | |

* cited by examiner

PRINTED CIRCUIT BOARD, METHOD OF MANUFACTURING SAME, AND METHOD OF MOUNTING THE CIRCUIT BOARD IN A CONNECTOR SOCKET

BACKGROUND

This application relates to methods of manufacturing and mounting a printed circuit board in a receiving socket such that electrical leads on the printed circuit board maintain good electrical connections with pins in the receiving socket. In particular, the application is concerned with creating a mounting structure that will ensure good electrical connections are maintained even when the assembly is subjected to significant levels of shock and vibration.

A printed circuit board (PCB) both mechanically supports and electrically connects electronic components. A PCB may include one or more non-conductive layers which provide mechanical support and electrical separation/insulation for one or more conductive layers. The one or more conductive layers, for example, may include any electrically conductive material such as copper, silver, aluminum, etc. The conductive layers may be formed on the PCB in patterns that allow leads of selected electrical components that are mounted on the PCB to be electrically connected to one another.

Figure 1A:
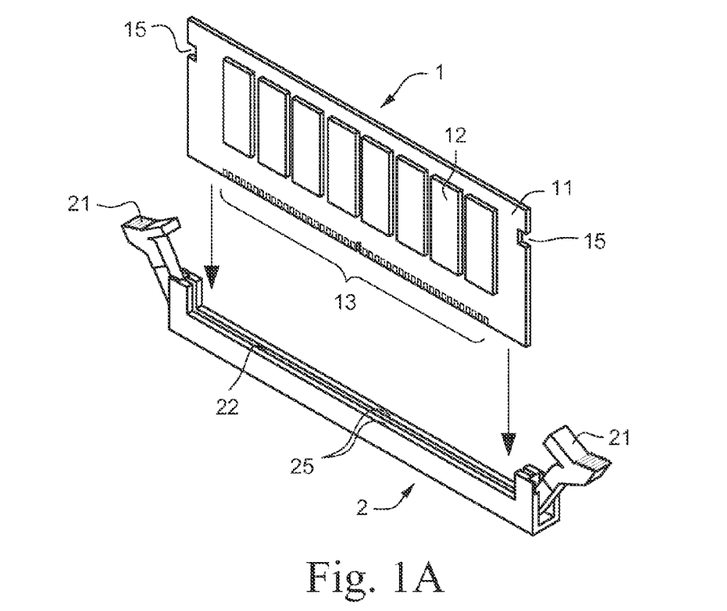
FIGS. 1A and 1B illustrated a background art PCB and mounting socket.
Figure 1B:
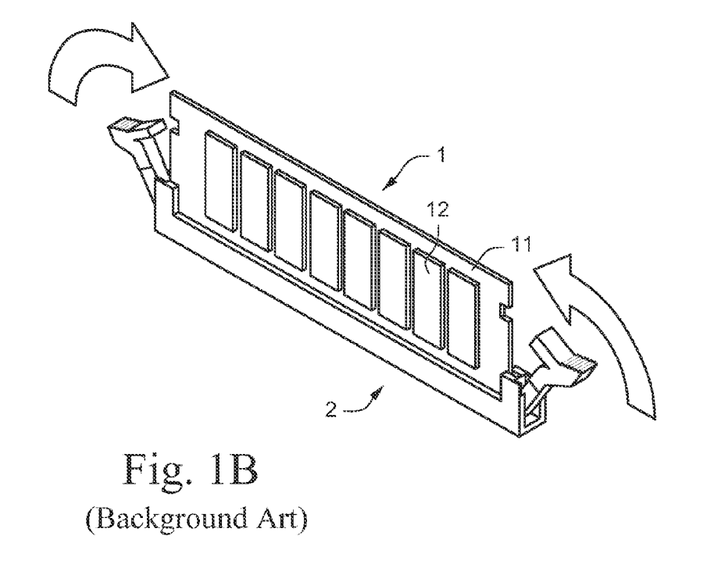

FIGS. 1A and 1B illustrate a related art PCB 1, and a mounting socket 2 that receives the PCB. The PCB 1 includes a substrate 11, electronic components 12, and a plurality of electrical leads 13 formed along the lower edge of the substrate 11. Electrical components 12 can be formed on both sides of the substrate. Likewise, separate electrical leads 13 may be formed on opposite sides of the substrate. Conductive layers or traces on the substrate electrically connect leads of the electrical components 12 to the electrical leads 13 on the bottom edge of the substrate.

The PCB is mounted in the socket 2 by pushing the lower edge of the PCB into a slot 22 formed between sidewalls 25 of the socket 2, as illustrated in FIG. 1B. Electrical contacts or pins in the slot 22 couple to the electrical leads 13 on sides of the bottom edge of the PCB 1. The socket may also include pivoting locking clips 21 that engage slots 15 on side edges of the PCB to hold the PCB 1 in the socket 2. When the locking clips 21 are pivoted outward away from the side edges of the PCB 1, they may exert an upward force on the bottom edge of the PCB 1 that tends to push the PCB 1 out of the slot 22 of the socket 2.

Unfortunately, when a PCB 1 and mounting slot 2 arrangement as shown in FIGS. 1A and 1B are subjected to significant levels of shock and vibration, the PCB 1 can move with respect to the mounting socket 2. This movement of the PCB 1 can cause an electrical connection between the electrical leads 13 on the bottom edge of the PCB 1 and contacts in the slot 22 to be broken temporarily broken or impaired. Although contact between the electrical contacts 13 and the leads in the slot 22 may not be completely broken, movements of the PCB 1 with respect to the mounting slot 22 may cause the electrical resistance of the connection to vary over time. And this change in electrical resistance alone could cause problems for signals traversing the connection. As a result of these factors, when such an assembly is subjected to significant shock and vibration, it is common for an electrical computing system using this arrangement to report faults or errors, or completely stop responding.

DETAILED DESCRIPTION OF EXEMPLARY EMBODIMENTS

A detailed description of exemplary embodiments is provided with reference to the accompanying drawings. Like reference numerals indicate like parts throughout the drawings.

Figure 2A:
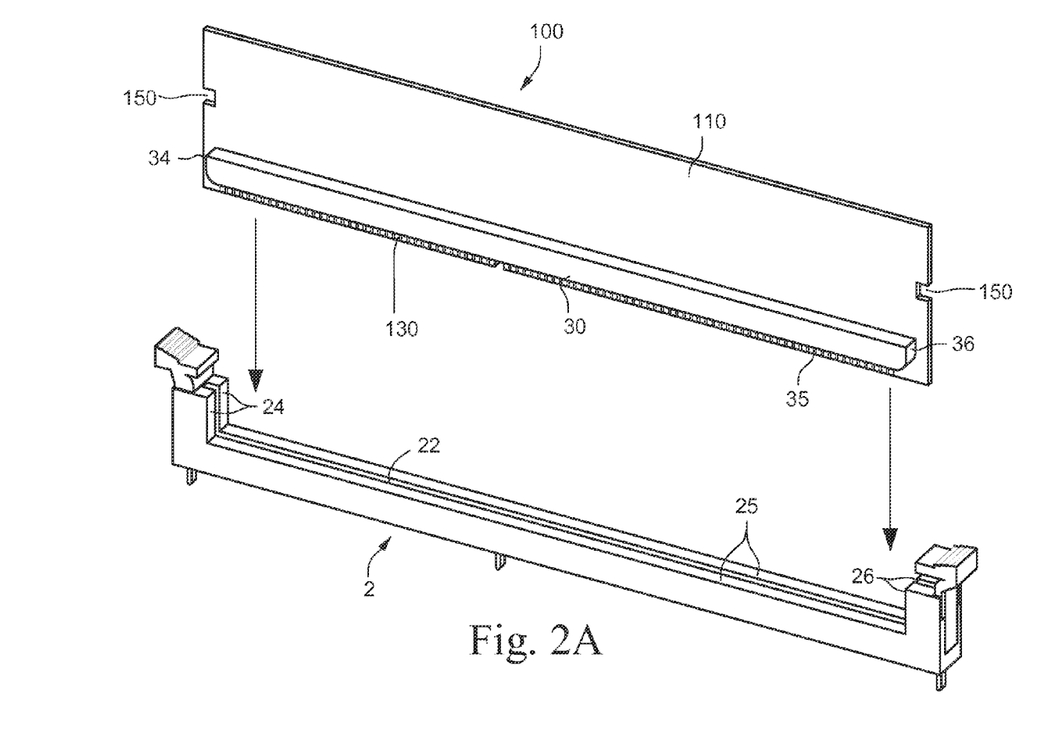
FIGS. 2A and 2B are perspective views of opposite sides of a first embodiment of a PCB having retention bosses that is positioned above a mounting slot.
Figure 2B:
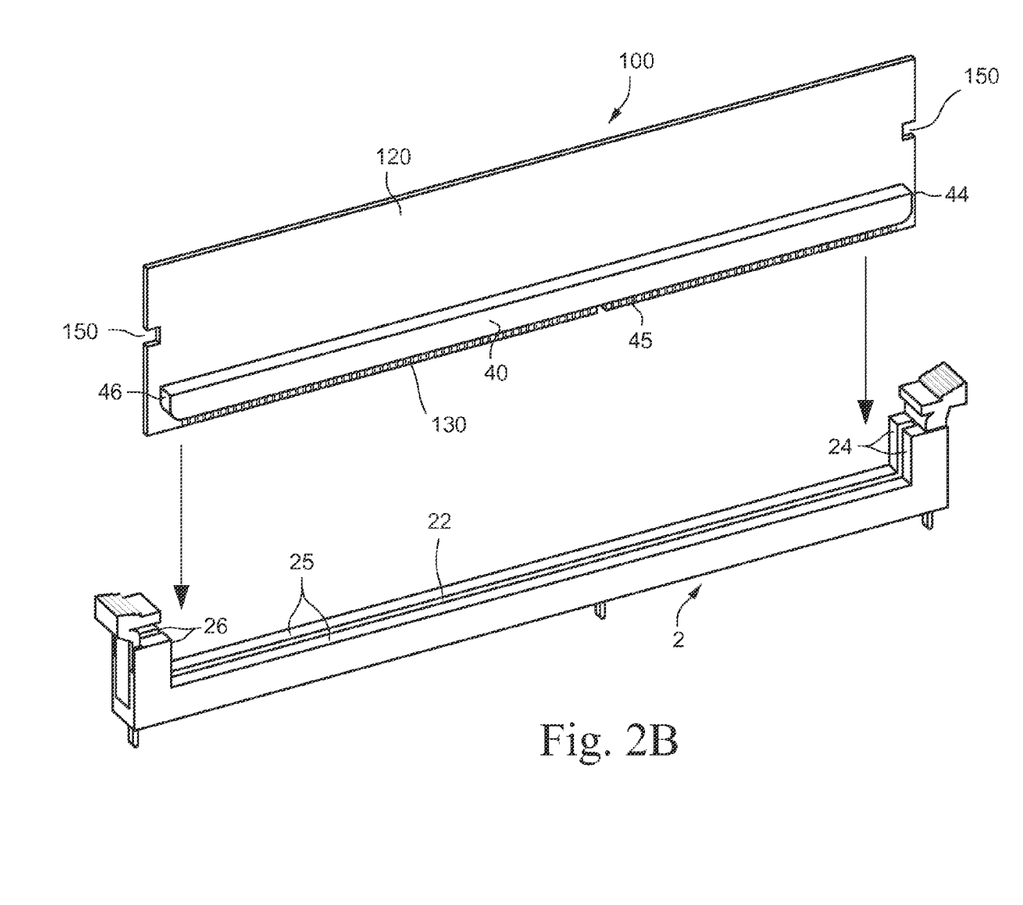

FIGS. 2A and 2B illustrate a printed circuit board (PCB) 100 positioned above a mounting socket. FIG. 2A shows a first side 110 of the PCB 100, and FIG. 2B shows a second, opposite side 120 of the PCB 100. As described above, a variety of electrical components would be mounted on one or both of the first and second sides 110, 120 of the PCB 100. Electrically conductive layers or traces would couple those electrical components to electrical leads 130 formed on the bottom edge of the PCB 100. For ease of illustration, however, the electrical components and electrically conductive leads and traces are not shown.

Figure 3:
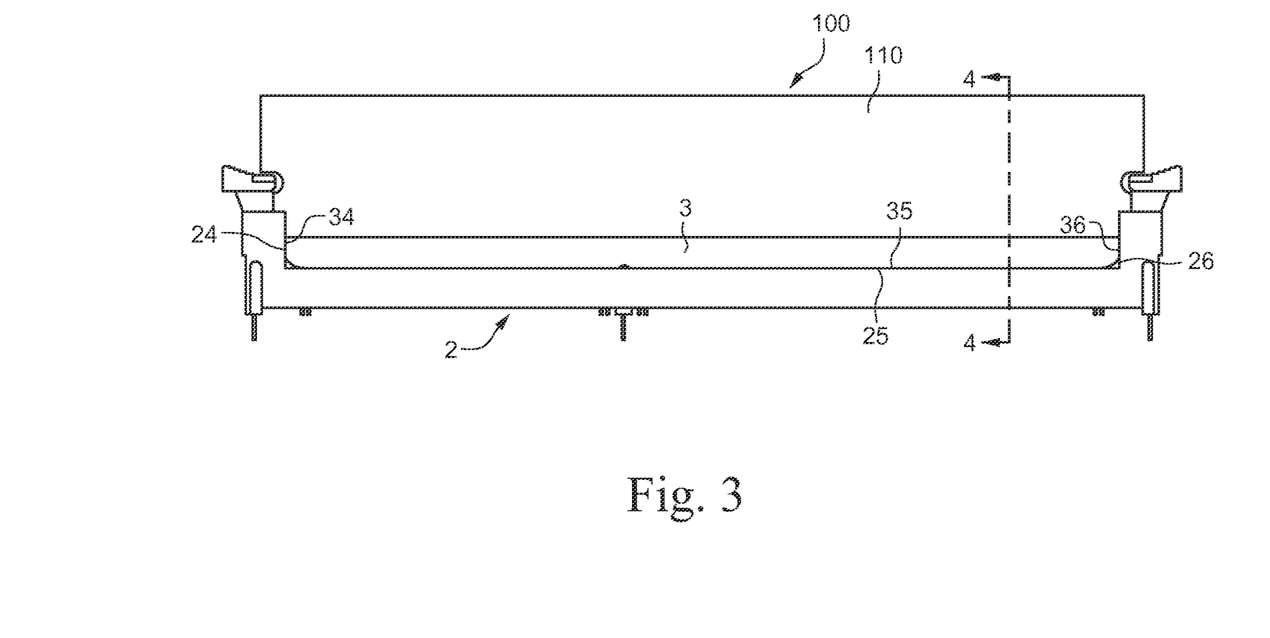
FIG. 3 is a side view of PCB having retention bosses mounted in a mounting slot.

One or more retention bosses are formed on the sides of the PCB 100. In the embodiment illustrated in FIGS. 2A and 2B, a first retention boss 30 is formed on the first side 110 of the PCB 100, and a second retention boss 40 is formed on the second side 120 of the PCB. The first and second retention bosses 30, 40 are formed adjacent the lower edge of the PCB, above the electrical leads 130. FIG. 3 shows the PCB 100 after it has been inserted into the mounting slot 22 of a mounting socket 2. Once the PCB 100 is inserted into the mounting slot 22, lower surfaces 35, 45 of the first and second retention bosses 30, 40 abut upper surfaces 25 of the mounting socket 2 on opposite sides of the mounting slot 22.

The presence of the first and second retention bosses 30, 40 helps to stabilize the PCB 100 with respect to the mounting socket 2 when the assembly is subjected to shock and vibration. Because bottom surfaces 35, 45 of the first and second retention bosses 30, 40 abut the upper surfaces 25 of the mounting socket 2, the PCB is less likely to wobble in the slot 22, or to rotate around the lower edge of the PCB, when the assembly is subjected to shock and vibration. Any rotation of the PCB that does occur is likely to be a pivoting movement around the upper surfaces 25 of the mounting socket 2, instead of a point lower down where the electrical leads 130 on the PCB are located. As a result, the bottom edge of the PCB and the electrical leads tend to move laterally from side to side against the bias of the electrical contacts 27 in the receiving slot 22 of the mounting socket 2. These aspects of the design cause any movements of the bottom edge of the PCB to smaller than movements that would occur if the retention bosses 30, 40 were not present. As a result, the electrical connections between the electrical leads 130 on the PCB and the electrical contacts 27 in the mounting socket 2 are better maintained when the assembly is subjected to shock and vibration.

The retention bosses 30, 40 may be any length. In some embodiments, the retention bosses may run along substantially the entire length of the PCB. In alternate embodiments, the retention bosses may only extend along a portion of the length of the PCB. In still other embodiments, two or more discontinuous segments of a retention boss may be formed along a single side of the PCB.

Figure 5:
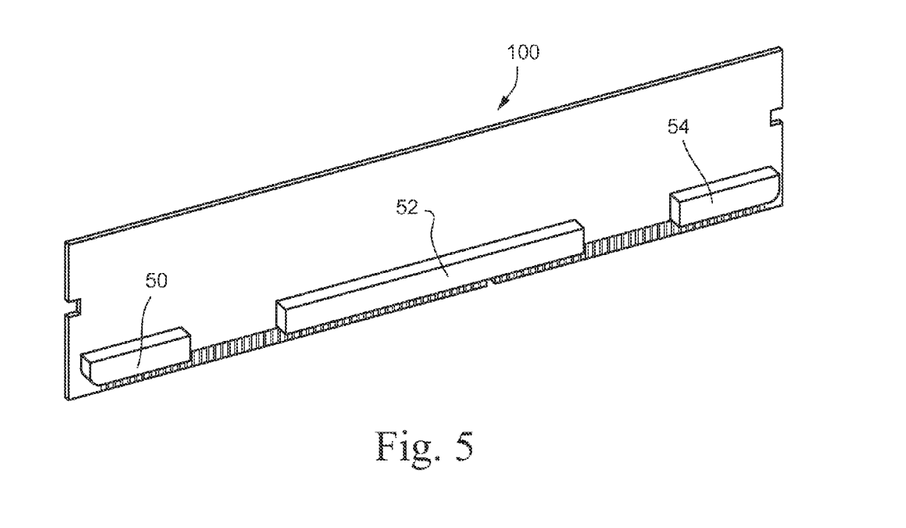
FIG. 5 is a perspective view of a PCB with discontinuous sections of a retention boss.

For example, FIG. 5 illustrates a PCB 100 with three discontinuous segments 50, 52, 54 of a retention boss formed on one side of the PCB. The retention boss may be made discontinuous to avoid covering up an electrical component that requires air cooling for proper operation. Alternatively, it may be advantageous to form only a few segments of the retention boss along the length of the PCB to minimize the weight of the assembly, or to reduce material consumption. Several separate segments of a retention boss formed along the length of the retention boss may provide most of the immobilizing benefits as a continuous retention boss formed along the entire length of the PCB.

In some embodiments, the length of the first retention boss 30 is controlled such that first and second end surfaces 34, 36 of the first retention boss 30 engage corresponding inner surfaces 24, 26 of the mounting socket. Likewise, a length of the second retention boss 40 is controlled such that first and second end surfaces 44, 46 of the second retention boss 40 engage corresponding inner surfaces 24, 26 of the mounting socket. The engagement between the first and second end surfaces of the retention bosses and the corresponding inner surfaces of the mounting socket 2 may also help to keep the PCB 100 from moving with respect to the mounting socket 2.

Figure 4:
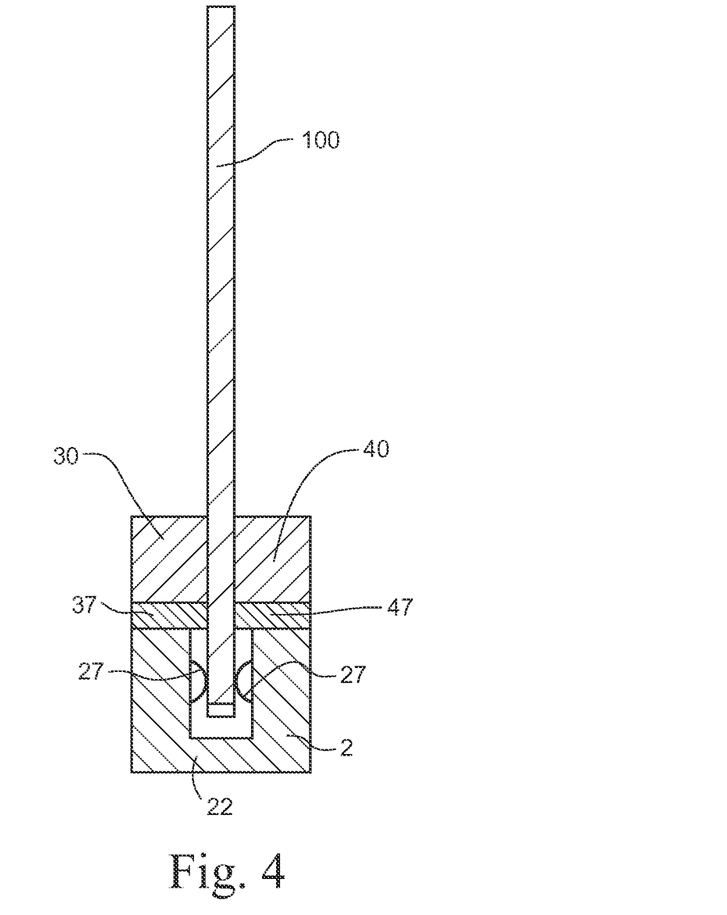
FIG. 4 is a cross-sectional view of a PCB having retention basses mounted in a mounting slot.

In some embodiments, an adhesive layer may be formed along the bottom surfaces 35, 45 of the first and second retention bosses 30, 40. When a PCB 100 having this configuration is mounted in a mounting slot 22 of a mounting socket 2, the adhesive layer bonds to the upper surfaces 25 of the mounting socket 2 on opposite sides of the mounting slot 22, which helps to further immobilize the PCB with respect to the mounting socket. FIG. 4 shows a cross-sectional view of a PCB 100 having this configuration.

As shown in FIG. 4, an adhesive layer 37 is formed on the lower surface of the first retention boss, and an adhesive layer 47 is formed on a bottom surface of the second retention boss 40. The adhesive layers 37, 47 bond to the top surfaces 25 of the mounting socket 2 located on opposite sides of the mounting slot 22. FIG. 4 also illustrates how electrical contacts 27 in the mounting slot 22 contact electrical leads on the bottom edge of the PCB 100.

Adhesive layers may also be provided on the end surfaces 34, 36, 44, 46 of the retention bosses. Such adhesive layers would bond to the corresponding inner side surfaces 24, 26 of the mounting socket 2 to help keep the PCB immobilized with respect to the mounting socket.

When adhesive layers are provided on surfaces of the retention bosses, the adhesive layers may initially be covered by a removable protective film. When one wishes to mount the PCB in a mounting socket, one would remove the protective film, then insert the PCB 100 into the mounting slot of the mounting socket until the adhesive layers contact and adhere to corresponding surfaces of the mounting socket.

The width of the bottom surfaces 35, 45 of the retention bosses 40, 50, may be greater than, equal to, or less than a width of the upper surfaces 25 of the mounting socket located on opposite sides of the slot 22 of the mounting socket 2.

As illustrated in FIG. 4, a cross-sectional shape of the retention bosses 30, 40 may be square or rectangular. However, the retention bosses could also have many other cross-sectional shapes.

Figure 6A:
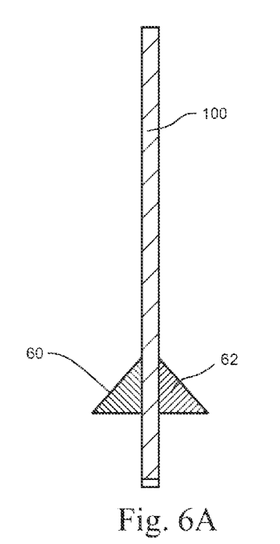
FIG. 6A-6C are cross-sectional views illustrating alternate cross-sectional shapes of retention bosses.
Figure 6B:
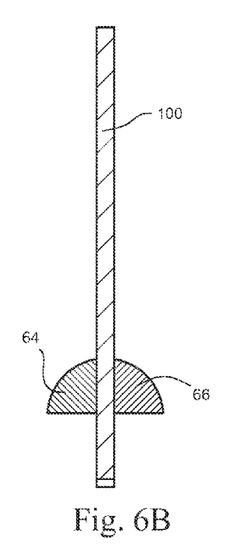
Figure 6C:
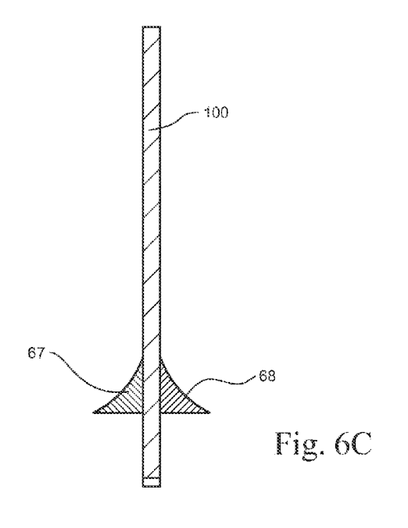

For example, FIG. 6A shows a PCB 100 with retention bosses 60, 62 having a triangular cross-sectional shape. FIG. 6B illustrates a PCB 100 with retention bosses 64, 66 having convex side surfaces. FIG. 6C illustrates a OCB 100 having retention bosses with concave side surfaces. Of course, many other cross-sectional shapes are also possible.

The retention bosses can be formed of any suitable material which does not interfere with the proper operation of the PCB 100. In some embodiments, it may be desirable for the material of the retention bosses to be electrically insulative, such that the retention bosses do not interfere with or short circuit any of the electrical components, conductive layers or traces that are formed on the PCB.

In some embodiments, the retention bosses may be formed of a molding resin, such as an epoxy resin. The resin preferably has a relatively high electrical resistivity, which helps to prevent any short circuiting of any electrical components, leads or metal traces covered by the resin.

In some embodiments, the retention bosses may be formed of a material that is semi-rigid. In these embodiments, it may be desirable to form the retention bosses such that they have a length that is slightly longer than the distance between the interior side surfaces 24, 26 of the mounting socket. As a result, the retention bosses will be slightly compressed and deformed when the PCB is inserted into the mounting socket. This will provide an interference fit that helps to keep the PCB immobilized with respect to the mounting socket.

In the embodiments described thus far, retention bosses are formed on opposite sides 110, 120 of a PCB 100. However, in alternate embodiments, a retention boss may be formed on only one side of a PCB. Further, if retention bosses are formed on opposite sides of a PCB, the retention boss on a first side of the PCB may have a different configuration than a retention boss on the opposite side of the PCB.

Figure 7:
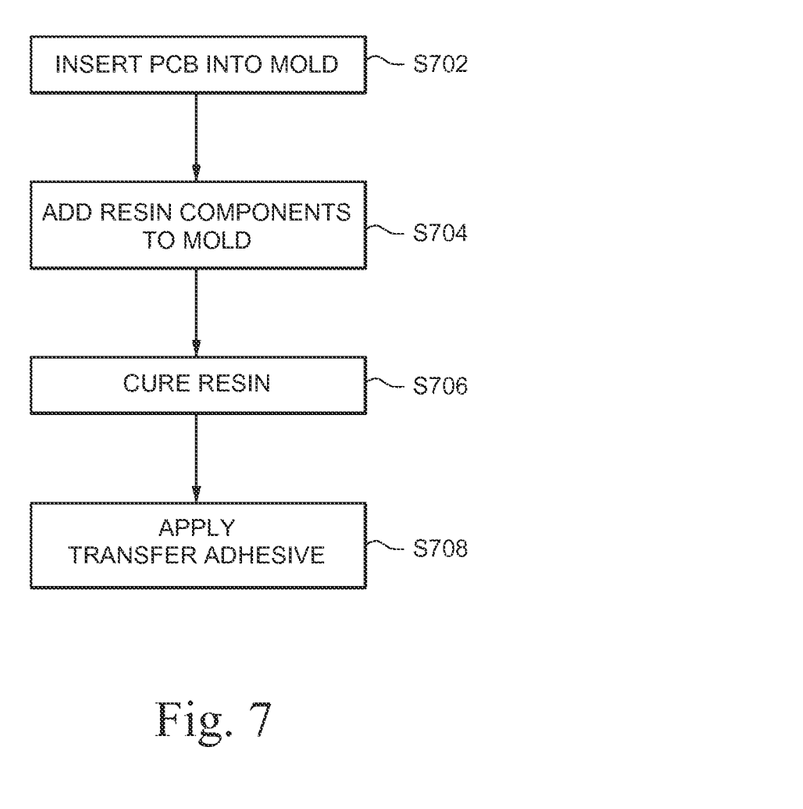
FIG. 7 illustrates steps of a method of forming a PCB with retention bosses.

FIG. 7 illustrates steps of forming a PCB having retention bosses. The method begins in step S702, when a PCB is inserted into a mold having one or more cavities that are configured to form the retention bosses. In step S704, a molding resin is inserted into the mold cavities. In step S706, the resin is allowed to cure. The PCB with the cured resin retention bosses is then removed from the mold.

In an optional final step S708, an adhesive is applied to selected surfaces of the retention bosses. As noted above, the surfaces of the adhesive opposite the retention bosses may be covered with a removable protective film.

The forgoing exemplary embodiments are intended to provide an understanding of the disclosure to one of ordinary skill in the art. The forgoing description is not intended to limit the inventive concept described in this application, the scope of which is defined in the following claims.

What is claimed is:

1. A method of forming at least one retention boss on at least one surface of a circuit board having electrical contacts located along a first edge of the circuit board, the method comprising:

inserting the circuit board into a mold having a cavity that is configured to form a molded retention boss on a first surface of the circuit board such that the molded retention boss protrudes from the first surface and extends parallel to and adjacent the first edge;

filling the mold cavity with a moldable material;

allowing the moldable material to cure and thereby form a molded retention boss on the first surface, the molded retention boss including a contact surface that is configured to contact a surface of a connector socket when the first edge of the circuit board is inserted into the connector socket; and removing the circuit board from the mold.

2. The method of claim 1, further comprising applying an adhesive layer to the contact surface of the molded retention boss.

3. The method of claim 1, wherein the filling step comprises filling the mold cavity with a moldable resin material that hardens when it cures.

4. The method of claim 1, wherein the inserting step comprises inserting the circuit board into a mold having first and second cavities that are configured to form first and second molded retention bosses, respectively, on first and second opposite surfaces of the circuit board such that the first and second molded retention bosses protrude from the first and second surfaces and extend parallel to and adjacent the first edge, wherein the filling step comprises filling the first and second mold cavities with a moldable material, and wherein the allowing step comprises allowing the moldable material to cure and thereby form first and second molded retention bosses on the first and second surfaces of the circuit board, respectively, the first and second molded retention bosses each including a contact surface that is configured to contact a surface of a connector socket when the first edge of the circuit board is inserted into the connector socket.

* * * * *